United States Patent [19]

O'Brien

[11] 3,941,455

[45] Mar. 2, 1976

[54] BI-STABLE IMAGE STORAGE APPARATUS

[75] Inventor: John Augustus O'Brien, Reading, Mass.

[73] Assignee: Itek Corporation, Lexington, Mass.

[22] Filed: Nov. 4, 1974

[21] Appl. No.: 520,580

[52] U.S. Cl. 350/160 LC; 340/173 LT; 250/213 R; 332/7.51
[51] Int. Cl.² .................... G11C 11/42; G02F 1/13
[58] Field of Search ..... 340/173; 350/160; 250/213; 332/7.51

[56] References Cited
UNITED STATES PATENTS

| | | | |
|---|---|---|---|
| 2,131,185 | 9/1938 | Knoll | 250/213 |
| 3,121,796 | 2/1864 | Reed | 250/213 |
| 3,154,687 | 10/1964 | Perl et al. | 250/213 |

*Primary Examiner*—Robert J. Webster
*Attorney, Agent, or Firm*—Homer O. Blair; Robert L. Nathans; Gerald H. Glanzman

[57] ABSTRACT

Bi-stable image storage apparatus for storing, interrogating, and erasing two-dimensional binary images represented by arrays of light and dark areas. The storage apparatus comprises a pair of image amplifiers, preferably, inverting amplifiers, coupled together into a closed loop optical circuit such that the output of one device will be read into the other device. As long as the gain of the circuit is greater than one the circuit will drive itself to saturation and store an image optically applied thereon. The system provides a very inexpensive circuit for storing images, and can be used in a wide variety of processing and display applications.

8 Claims, 3 Drawing Figures

BI-STABLE IMAGE STORAGE APPARATUS

BACKGROUND OF THE INVENTION

1. Field of the Invention

The present invention relates generally to an image storage apparatus. More particularly, the present invention relates to an inexpensive bi-stable image storage apparatus which can be utilized to store, interrogate and erase a two-dimensional binary image represented by an array of dark and light spots.

2. Description of the Prior Art

Although there are light addressable, light readable devices available in the prior art which, in themselves, have a memory capability and thus, can be used to store binary data optically presented thereto, the present state of development of these devices makes them somewhat limited as to the number of applications in which they can practicably be used. For one thing, they are relatively expensive. For another, they generally are manufactured in relatively small sizes, for example, a few square inches, and thus cannot readily be used to store large sized images, at least without using many small devices joined together in a matrix. Accordingly, there is a need for a low cost light addressable, light readable system which can store binary images and which can be made in relatively large sizes.

SUMMARY OF A PREFERRED EMBODIMENT OF THE INVENTION

In accordance with the present invention, an improved image storage apparatus is provided which consists of a pair of light addressable, light readable image amplifier devices coupled together into a closed loop optical circuit. Specifically, the output of one of the devices is imaged or optically coupled to the input of the second device while the output of the second device is optically coupled to the input of the first device. As long as such a circuit has a gain of greater than one in some region of its operating range, it will quickly drive itself to saturation and lock in on an image presented thereto.

In a presently preferred embodiment, the image amplifiers comprise light addressable liquid crystal panels which are operated as inverting amplifiers such that the output of one of the panels will be the positive of the image applied to the circuit while the output of the other panel will be the negative of the image applied.

An image can be read into the circuit optically by briefly interrupting the optical connection between the two panels and then projecting the desired image onto one of the panels. When the projected image is removed, the image will be locked into the circuit.

In the presently most preferred embodiment, one or both panels is partitioned into distinct spaced areas by a suitable mask positioned adjacent to their input or output side. With these masks, image registration problems can be minimized while still providing moderate resolution images.

With the storage circuit described above, two-dimensional arrays of binary numbers represented by light and dark areas can be read into and stored in the circuit for use in image processing applications. Alternatively, half-tone pictures can be stored for display and other applications.

In general, the system provided requires only readily available, low cost components and this makes the circuit usable in a wide variety of fields. Other features, advantages and uses of the invention will be set forth in greater detail hereinafter in conjunction with the detailed description of the preferred embodiments.

DETAILED DESCRIPTION OF THE PREFERRED EMBODIMENTS

Figure 1:
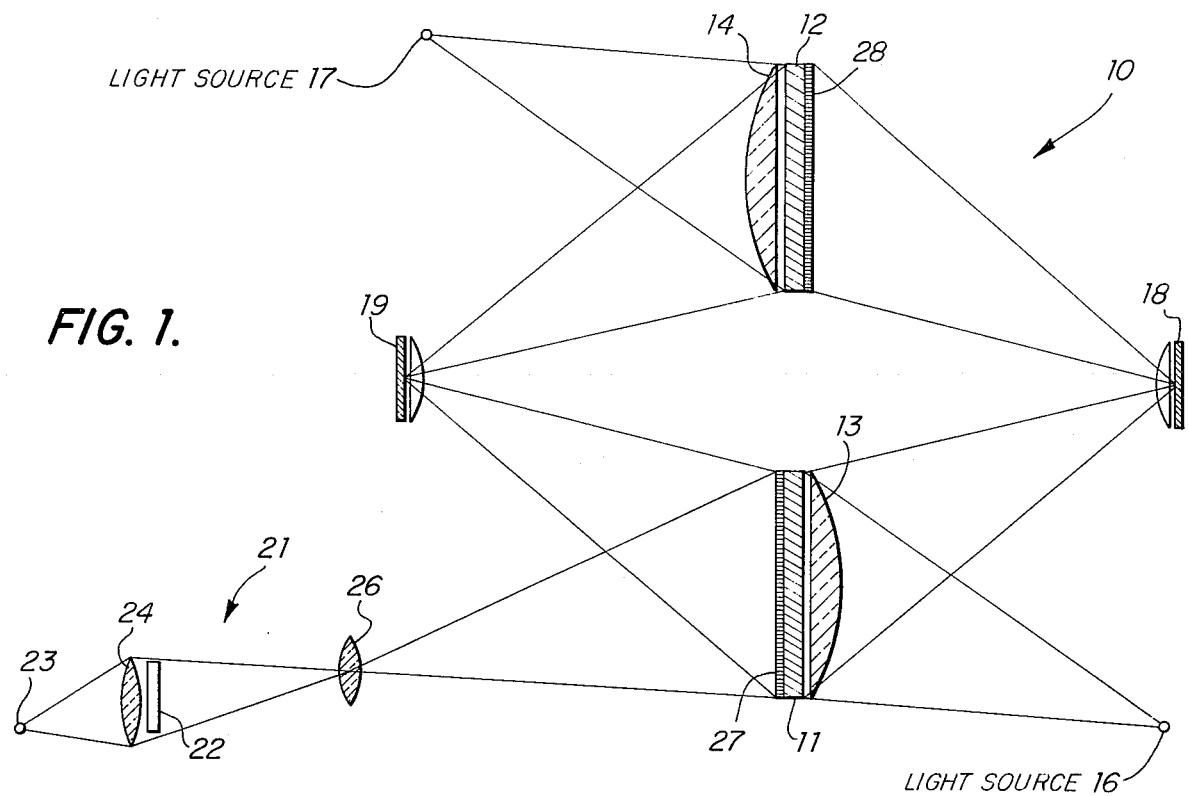
FIG. 1 schematically illustrates an image latch-up system in accordance with a presently preferred embodiment of the invention.

FIG. 1 schematically illustrates an image latch-up or storage system according to a presently preferred embodiment of the invention. The system includes a pair of light addressable, light readable image amplifying devices 11 and 12 optically coupled together into a closed loop optical circuit generally designated by reference number 10. Image amplifiers 11 and 12 can be formed from any one of a variety of light addressable, light readable devices such as light addressed electrophoretic display panels, electro-optic photosensitive devices utilizing the electro-optic and birefringent characteristics of Bismuth Silicon Oxide (although this device, itself, has a memory capability) or even a properly connected array of photosensors and light emitters. The presently most preferred devices, however, comprise light addressed, liquid crystal panels (LALC panels) operated to obtain the action of inverting amplifiers. The details of the operation of light addressable liquid crystal panels need not be described in detail herein inasmuch as they are well understood by those skilled in the art. Suffice it to say that LALC panels can be operated as inverting amplifiers by using specularly reflected light from the liquid crystal side. With such an arrangement, the electrical connections are such that a photosensitive element or region on the input side of the panel is electrically in series with a corresponding element or region of the liquid crystal. When there is little or no light on a given photosensitive area, the applied voltage will be mostly across the photoresistance and the corresponding liquid crystal area will have little voltage across it and thus remain non-scattering to incident light. Light can then be specularly reflected from that area of the liquid crystal and thus the device is acting as an inverter. When light is applied to the photosensitive area, the photoresistance decreases, the voltage across the liquid crystal area increases, and the liquid crystal scatters light and thus becomes non-useful for specular reflection.

To complete the circuit of FIG. 1, a pair of field lenses 13 and 14 are positioned adjacent to the output sides of amplifiers 11 and 12, respectively. These lenses image the readout light from light sources 16 and 17, respectively, onto imaging lens and mirror combinations 18 and 19, respectively, so that only specularly reflected light can reach the input of one amplifier from the output of the other. Thus, the output of amplifier 11 will be projected via mirror-lens combination 18 to be the input of amplifier 12 while the output of amplifier 12 will be projected via mirror-lens combination 19 to be the input of amplifier 11, to thus form closed loop feed-back circuit 10.

Figure 3:
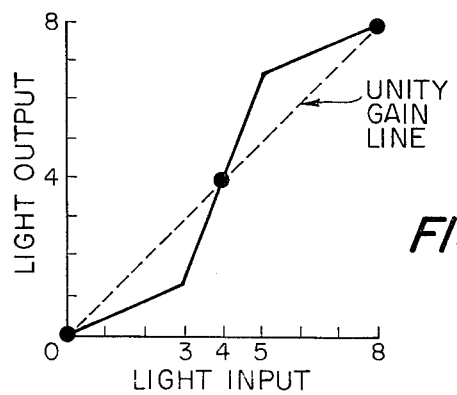
FIG. 3 is provided to graphically explain the operation of the systems of FIGS. 1 or 2.

As long as circuit 10 has a gain of greater than one in some region of its operating range, it will rapidly drive itself to saturation in one direction or the other depending upon initial conditions. This can, perhaps, be better understood by reviewing FIG. 3 which graphically depicts the response of two amplifiers coupled in series (open loop). With the arbitrary units shown, the dynamic gain of two devices in series is less than 1 when the input light level is less than 3 or more than 5. The dynamic gain is greater than 1 between light levels of 3 and 5. The d.c. gain is less than 1 with an input of less than 4 units and greater than 1 for an input of greater than 4 units.

From the above, if the loop were closed, the gain graph could be correct at only three points; 0, 4 and 8 units of light. The 0 and 8 levels are stable and the 4 level is unstable. If the input light level at one of the panels is greater than 4 units, then the action of the loop characteristics would be to cause the light level to increase until saturation was reached at an input level of 8 units. Conversely, the initial input level of the second panel would be less than 4 units (since the panels act as inverting amplifiers), and its level would decrease until its light input stabilizes at 0 units. Because the d.c. gain will remain greater than 1, this will be a stable condition, and the loop will remain in that condition. A second stable condition can exist with the roles of the two panels reversed. Thus, we have a bi-stable device.

From the above, if the image of an object were then projected, for example, onto the input of amplifier 11, the circuit will rapidly lock onto and retain that image even after the object is removed. To accomplish image read in, an imaging apparatus 21 is provided. Specifically, in FIG. 1, the imaging apparatus for a light transmissive object such as a transparency 22 is illustrated. This transparency, which contains the information to be stored as an array of transparent and opaque (minimally transparent) areas, is illuminated by a light source 23 through a field lens 24. The information on the transparency is projected onto the photosensitive side of amplifier 11 through a projection lens 26.

The preferred method of setting the information from transparency 22 into the circuit 10, is to first reset the circuit 10 to a non-image state by momentarily interrupting the light input to panel 11, preferably by momentarily turning off light source 17. With no input light, panel 11 will then be specularly reflective over its entire surface and as a consequence, the input to panel 12 will be completely illuminated and its output rendered non specularly reflective. Light source 17 can then be turned on again with no change taking place. Transparency 22 is then projected onto the input of panel 11 and the feedback action causes it to be stored. The negative of the image read into amplifier 11 will then be read out by light source 16 and imaged onto amplifier 12. The output of amplifier 12, which will be the positive of the initial image will then be read out by light source 17 and directed back to the input of panel 11. The imaging system 21 can then be removed and the information on the transparency will remain in the circuit 10 as long as sources 16 and 17 are left on and the circuit is not interrupted.

The information stored in the circuit can easily be read out therefrom without losing the information stored therein. This can be done by either using the scattered light from the amplifier outputs, or by using an additional light source which would be imaged by the field lens 13 onto an additional projection lens. Either the positive or the negative can be read out depending on the portion of the circuit being interrogated. This is an important capability in data processing applications. By using several light sources, spatially separated, the output of a panel can be sensed without interfering with the feedback light. With such structure, therefore, the output of one device can be used to interrogate the output of another device in another circuit to effect a logical multiplication. Other image processing activities such as ANDing, Oring, and shifting can also be carried out in ways readily apparent to those skilled in the art.

If perfect image registration could be maintained in the operation of the circuit 10, the structure so far described, would be fully adequate for essentially all applications. In other words, it is obviously essential that the output image from panel 12 be superimposed directly on top of the image initially projected onto panel 11 from imaging system 21. Without perfect registration, the image would move further and further out of position with every cycle through the circuit and would rapidly deteriorate. Because perfect registration would be difficult to attain, and at the very least, would necessitate high cost, high precision optics, it is preferable to partition the image into an array of discrete spaced areas so that some misregistration can be tolerated. This can conveniently be accomplished by applying a pair of masking elements 27 and 28 to the input (or output) sides of the panels 11 and 12, respectively. These masking members comprise a two-dimensional array of spaced apertures of any desired shape on an opaque background. By making the spacing between the openings of sufficient size, interference between adjacent image areas can be prevented, and, as long as at least some light passes through the desired aperture, the image can be maintained in the circuit in proper registration. The use of a mask serves to disect the optical circuit into a large number of independent single element light amplifiers. Although two masks are described above for reasons of symmetry, one mask would be sufficient. The resolution of the system (i.e., the mask aperture spacing) is determined by the resolution of the light amplifying panels and the quality and adjustability of the optical elements. In a typical system, if panels 11 and 12 are about 1 foot square, a mask having an array of 100 by 100 openings equally spaced over the input side of the amplifier will provide reasonably good resolution while avoiding the registration problems.

Figure 2:
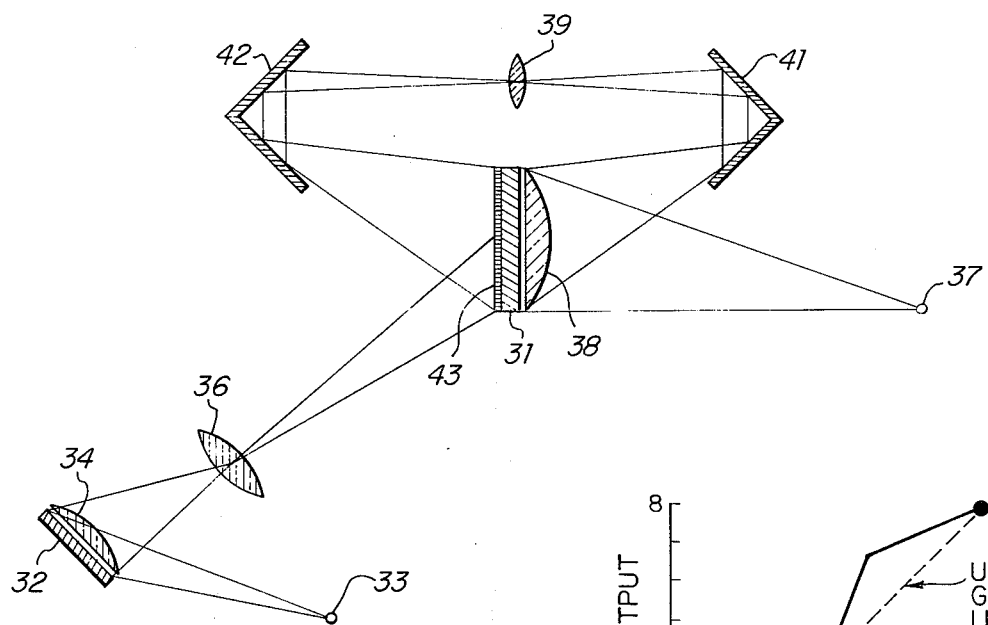
FIG. 2 schematically illustrates an alternative embodiment of the invention.

FIG. 2 illustrates an alternative embodiment of the invention in which only a single light addressed liquid crystal panel need be used. In this embodiment, rather than employing two panels, two different areas of the same panel are utilized. Specifically, panel 31 is substantially identical to those utilized in FIG. 1. An image from an object, herein a reflective object 32, for example, is projected onto one half of the panel 31 by means of light source 33, field lens 34, and projection lens 36. The output of panel 31 is read out by light source 37, (which is imaged onto lens 39 by field lens 38 and corner reflector 41). Lens 39 then projects an inverted image back onto the other half of the input of panel 31 via reflector 42. Following another loop through the optical circuit, the image will be reinverted and thus projected back onto itself as in FIG. 1. As in FIG. 1, panel 31 is also preferably provided with a mask 43.

Although, what has been described are presently preferred embodiments of the invention, it should be apparent that many additions, omissions, and modifications could be made without departing from the scope thereof. For example, if desired, a variety of other components such as shutters, shifting controls and the like may be added to the circuit for specific applications. Accordingly, it should be understood that the invention should be limited only insofar as required by the scope of the following claims.

What is claimed is:
1. Image storage apparatus comprising:
   a. an image storage circuit for storing a desired radiation pattern, said image storage circuit including:
      1. first and second image amplifier means, each of said first and second image amplifier means comprising inverting amplifier means for generating an output radiation pattern that is the negative of an input radiation pattern applied thereto;
      2. first transfer means for directing the output radiation pattern of said first image amplifier means to said second image amplifier means to be the input radiation pattern thereof; and
      3. second transfer means for directing the output radiation pattern of said second image amplifier means to said first image amplifier means to the input radiation pattern thereof; and
   b. means for optically applying said desired radiation pattern to said circuit to be stored therein, said optical applying means comprising means for projecting said desired radiation pattern onto said first image amplifier means to be the input radiation pattern thereof; such that the output radiation pattern of said first image amplifier means will be the negative of said desired radiation pattern and the output radiation pattern of said second image amplifier means will be the positive of said desired radiation pattern.

2. Apparatus as recited in claim 1 wherein said radiation patterns comprise two-dimensional arrays of light and dark areas.

3. Apparatus as recited in claim 2 wherein at least one of said amplifier means further includes masking means associated therewith, said masking means comprising an array of spaced apertures for partitioning said radiation patterns.

4. Apparatus as recited in claim 3 wherein said masking means is positioned adjacent to the input of said amplifier means.

5. Apparatus as recited in claim 2 wherein said first and second amplifier means comprise light addressed liquid crystal panels.

6. Apparatus as recited in claim 2 wherein said first and second amplifier means comprise different portions of a single light addressed liquid crystal panel.

7. Apparatus as recited in claim 2 wherein said desired radiation pattern comprises a half-tone image.

8. Apparatus as recited in claim 2 wherein said circuit includes means for erasing the radiation pattern stored therein.

* * * * *